United States Patent
Mauricia (10) Patent No.: US 8,978,988 B2
(45) Date of Patent: *Mar. 17, 2015

(54) SYSTEMS AND METHODS FOR INTEGRATING RADIO-FREQUENCY IDENTIFICATION CIRCUITRY INTO FLEXIBLE CIRCUITS

(71) Applicant: Apple Inc., Cupertino, CA (US)

(72) Inventor: Juan Carlos Mauricia, Menlo Park, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 14/046,799

(22) Filed: Oct. 4, 2013

(65) Prior Publication Data

US 2014/0033515 A1 Feb. 6, 2014

Related U.S. Application Data (63) Continuation of application No. 12/884,736, filed on Sep. 17, 2010, now Pat. No. 8,584,955.

(51) Int. Cl.
| | | |
|---|---|---|
| *G06K 19/06* | (2006.01) | |
| *G08B 13/14* | (2006.01) | |
| *H01P 11/00* | (2006.01) | |

(Continued)

(52) U.S. Cl.
CPC ...... *G06K 19/07749* (2013.01); *H01L 23/4985* (2013.01); *H01L 23/49855* (2013.01); *H01L 2924/14* (2013.01); *H05K 1/189* (2013.01); *H05K 2201/09754* (2013.01); *H05K 2201/10098* (2013.01); *H01L 2924/0002* (2013.01)
USPC ........... 235/492; 235/488; 340/572.7; 29/601

(58) Field of Classification Search
USPC ......... 235/492, 488; 340/572.1, 572.7, 572.8; 343/700 MS; 29/600, 601
See application file for complete search history.

(56) References Cited

U.S. PATENT DOCUMENTS

| | | | |
|---|---|---|---|
| 5,528,222 A | 6/1996 | Moskowitz et al. | |
| 6,050,622 A | 4/2000 | Gustafson | |

(Continued)

FOREIGN PATENT DOCUMENTS

| | | |
|---|---|---|
| DE | 19811578 | 10/1999 |
| JP | 2003203527 A | 7/2003 |

(Continued)

OTHER PUBLICATIONS

European Patent Application No. 11760603.8—Office Action dated Jan. 3, 2014.

(Continued)

*Primary Examiner* — Michael G Lee
*Assistant Examiner* — Suezu Ellis
(74) *Attorney, Agent, or Firm* — Womble Carlyle Sandridge & Rice, LLP (57) ABSTRACT

Systems and methods for integrating radio-frequency identification (RFID) circuitry into flexible circuits are provided. An RFID integrated circuit can be embedded within a dielectric layer of a flexible circuit or between a dielectric layer and a conductive layer of the flexible circuit. Additionally or alternatively, an RFID antenna may be integrated into a conductive layer of the flexible circuit. Alternatively, both the integrated circuit and antenna of RFID circuitry may be provided off of the flexible circuit but an RFID connector coupling the integrated circuit and antenna may be integrated into the flexible circuit.

20 Claims, 3 Drawing Sheets

(51) Int. Cl.
*H01Q 13/00* (2006.01)
*H01Q 17/00* (2006.01)
*G06K 19/077* (2006.01)
*H01L 23/498* (2006.01)
*H05K 1/18* (2006.01)

(56) References Cited

U.S. PATENT DOCUMENTS

| | | | |
|---|---|---|---|
| 6,094,138 | A | 7/2000 | Eberhardt et al. |
| 6,888,502 | B2 | 5/2005 | Beigel et al. |
| 6,973,243 | B2 | 12/2005 | Koyasu et al. |
| 8,195,236 | B2 | 6/2012 | Itay et al. |
| 2007/0193021 | A1* | 8/2007 | Kobayashi et al. ............ 29/601 |
| 2008/0042558 | A1 | 2/2008 | Buchhauser et al. |
| 2008/0099559 | A1 | 5/2008 | Lo et al. |
| 2008/0204235 | A1 | 8/2008 | Cook |
| 2009/0167699 | A1 | 7/2009 | Rosenblatt et al. |
| 2009/0173533 | A1* | 7/2009 | Brock et al. ................. 174/350 |
| 2009/0206474 | A1* | 8/2009 | Ferguson et al. ............. 257/728 |
| 2010/0190528 | A1 | 7/2010 | Hsiao et al. |
| 2011/0136554 | A1* | 6/2011 | Wong et al. ................. 455/575.4 |

FOREIGN PATENT DOCUMENTS

| | | |
|---|---|---|
| WO | 2004072988 A1 | 8/2004 |
| WO | 2009118505 A1 | 10/2009 |
| WO | 2011107402 | 9/2011 |

OTHER PUBLICATIONS

PCT Application No. PCT/US2011/048577—International Preliminary Report on Patentability dated Oct. 8, 2012.
PCT International Search Report, App. No. PCT/US20011/048577, dated Nov. 3, 2011.
PCT Written Opinion of the International Searching Authority, App. No. PCT/US20011/048577, dated Nov. 3, 2011.
Korean Patent Application No. 10-2013-7009644—Office Action dated Mar. 17, 2014.

* cited by examiner

SYSTEMS AND METHODS FOR INTEGRATING RADIO-FREQUENCY IDENTIFICATION CIRCUITRY INTO FLEXIBLE CIRCUITS

CROSS-REFERENCE TO RELATED APPLICATIONS

This application is a continuation of, and claims priority to, U.S. patent application Ser. No. 12/884,736 filed Sep. 17, 2010, entitled "SYSTEMS AND METHODS FOR INTEGRATING RADIO-FREQUENCY IDENTIFICATION CIRCUITRY INTO FLEXIBLE CIRCUITS" by Juan Carlos MAURICIA, which is incorporated herein by reference in its entirety for all purposes.

BACKGROUND OF THE DISCLOSURE

Radio-frequency identification ("RFID") circuitry is commonly used to identify and track various objects. For example, electronic devices (e.g., portable media players), which may include two or more electronic components coupled by a flexible circuit, often also include RFID circuitry integrated into one of the electronic components. However, such RFID circuitry often takes up valuable real estate of the electronic component. Moreover, the radio wave communications of such RFID circuitry often cause radio frequency ("RF") interference that can affect the operation of the electronic component. This can reduce the operating efficiency of such electronic devices.

SUMMARY OF THE DISCLOSURE

Systems and methods are disclosed for integrating RFID circuitry into a flexible circuit. Portions of the flexible circuit may provide RF shielding for signals radiated by the RFID circuitry.

BRIEF DESCRIPTION OF THE DRAWINGS

The above and other aspects of the invention, its nature, and various features will become more apparent upon consideration of the following detailed description, taken in conjunction with the accompanying drawings, in which like reference characters refer to like parts throughout, and in which.

DETAILED DESCRIPTION OF THE DISCLOSURE

Systems and methods for integrating RFID circuitry into flexible circuits are provided. An RFID integrated circuit can be embedded within a dielectric layer of a flexible circuit or between a dielectric layer and a conductive layer of the flexible circuit. Additionally or alternatively, an RFID antenna may be integrated into a conductive layer of the flexible circuit. Alternatively, both the integrated circuit and antenna of RFID circuitry may be provided off of the flexible circuit but an RFID connector coupling the integrated circuit and antenna may be integrated into the flexible circuit.

An insulation via may be provided through the flexible circuit to shield other portions of the flexible circuit from RF signals radiated by the RFID circuitry. The RFID circuitry may be positioned between such an insulation via and a side of the flexible circuitry so that the RF signals may be radiated out through the side of the flexible circuit.

Figure 1A:
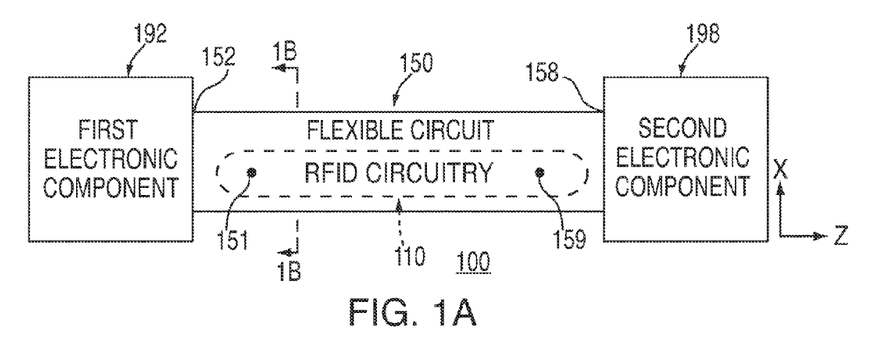
FIG. 1A is an illustrative top view of a system with RFID circuitry integrated into a flexible circuit, in accordance with some embodiments of the invention.

FIG. 1A is an illustrative top view of a system 100 that may include RFID circuitry 110 integrated into a flexible circuit 150 in accordance with some embodiments of the invention. Flexible circuit 150 may be any suitable type of flexible circuit, which may be curved, bent, or rolled, and that may be capable of conducting one or more signals therethrough, including, but not limited to, a single-sided flex circuit, a double access or back bared flex circuit, a sculptured flex circuit, a double-sided flex circuit, a multi-layer flex circuit, a rigid-flex circuit, a polymer thick film flex circuit, and any combination thereof. RFID circuitry 110 may be any suitable type of RFID circuitry capable of communicating and/or processing RF signals, including, but not limited to, active RFID circuitry, passive RFID circuitry, battery assisted passive ("BAP") RFID circuitry, and any combination thereof.

As shown in FIG. 1A, system 100 may also include a first electronic component 192 and a second electronic component 198 that may be coupled together via flexible circuit 150. For example, a first end 152 of flexible circuit 150 may be coupled to first electronic component 192 and a second end 158 of flexible circuit 150 may be coupled to second electronic component 198. Each one of components 192 and 198 may be any suitable electronic component capable of communicating one or more signals via flexible circuit 150, including, but not limited to, a processing component, a memory component, a user input/output ("I/O") interface, a circuit board on which one or more other electronic components may be interconnected, a transducer, communications circuitry, and any combination thereof.

In some embodiments, system 100 may be a single electronic device that includes RFID circuitry 110, flexible circuit 150, and one or both of first electronic component 192 and second electronic component 198. For example, system 100 may be any suitable electronic device having at least one electronic component coupled to a flexible circuit, including any portable, mobile, hand-held, or miniature consumer electronic device. Alternatively, such an electronic device may not be portable at all. Illustrative electronic devices can include, but are not limited to, media players (e.g., an iPod™ available by Apple Inc. of Cupertino, Calif.), media recorders, radios, medical equipment, domestic appliances, transportation vehicle instruments, musical instruments, calculators, cellular telephones (e.g., an iPhone available by Apple Inc.), other wireless communication devices, personal digital assistants, remote controls, pagers, computers (e.g., a desktop, laptop, tablet, server, etc.), monitors, televisions, stereo equipment, set up boxes, set-top boxes, modems, routers, printers, and combinations thereof. Alternatively, system 100 may include RFID circuitry 110 and flexible circuit 150 with or without first electronic component 192 and/or second electronic component 198, each of which may be distinct electronic components not provided in a single electronic device.

Figure 1B:
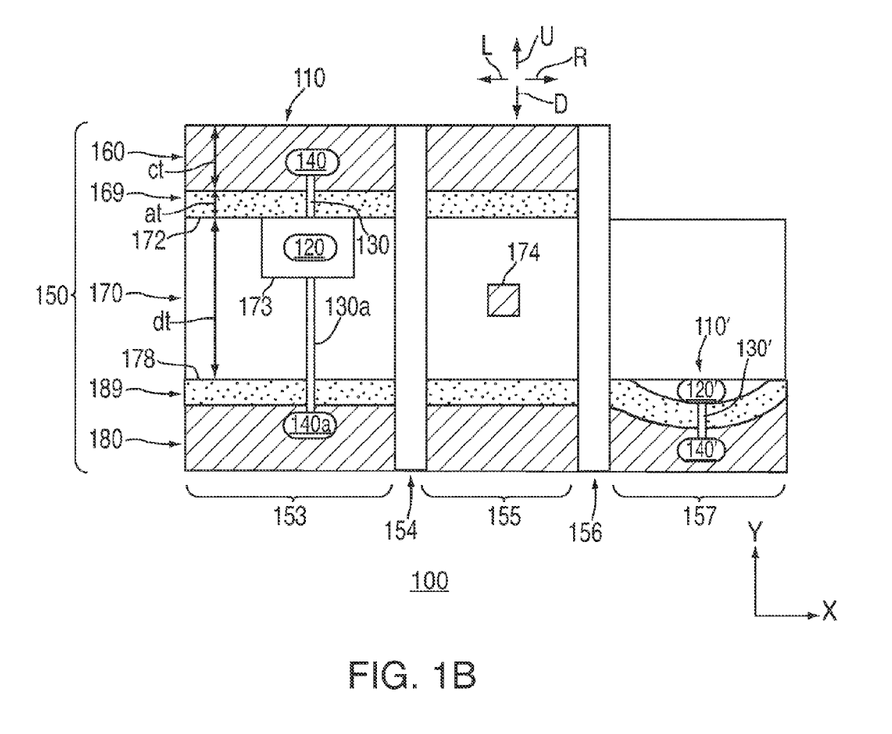
FIG. 1B is a horizontal cross-sectional view of the system of FIG. 1A, taken from line IB-IB of FIG. 1A, in accordance with some embodiments of the invention.

Referring now to FIG. 1B, which is a horizontal cross-sectional view of system 100, taken from line IB-IB of FIG. 1A, flexible circuit 150 may include a stack of one or more conductive layers and one or more dielectric layers. For example, as shown, flexible circuit 150 may include a top conductive layer 160 positioned along the top surface 172 of a first dielectric layer 170. Dielectric layer 170 may be a flexible insulator that can provide a foundation for conductive layer 160. For example, dielectric layer 170 may be formed from any suitable insulative material, such as polyimide ("PI") (e.g., Kapton™ polymide film), polyester ("PET polyethylene napthalate ("PEN"), polyetherimide ("PEI"), polyurethane, any one of various fluropolymers ("FEP") and/or copolymers, and combinations thereof. Moreover, dielectric layer 170 may have any suitable thickness dt. For example, thickness dt may be in the range of 5 microns to 150 microns. In some embodiments, thickness dt may be in the range of microns to 60 microns, while in other embodiments, thickness dt may be in the range of 25 microns to 55 microns. It is understood that thickness dt of dielectric layer 170 may be widely varied and is not limited to these examples.

Top conductive layer 160 may be a conductive element from which one or more circuit signal paths may be provided. For example, conductive layer 160 may be formed from any suitable conductive material, such as copper ("CU"), gold ("AU"), or aluminum ("AL"), which may or may not be treated with various types of treatments, such as being annealed or plated. Moreover, conductive layer 160 may have any suitable thickness ct. For example, thickness ct may be in the range of 5 microns to 50 microns. In some embodiments, thickness ct may be in the range of 10 microns to 30 microns, while in other embodiments, thickness ct may be in the range of 12 microns to 28 microns. It is understood that thickness ct of conductive layer 160 may be widely varied and is not limited to these examples.

In some embodiments, as shown in FIG. 1B, for example, an adhesive layer 169 may be provided between at least a portion of top conductive layer 160 and at least a portion of top surface 172 of first dielectric layer 170. Adhesive layer 169 may be provided using any suitable adhesive that may maintain conductive layer 160 and dielectric layer 170 in a fixed relationship. Adhesive layer 169 may have any suitable thickness at. For example, thickness at may be in the range of 5 microns to 50 microns. In some embodiments, thickness at may be in the range of 10 microns to 30 microns, while in other embodiments, thickness at may be in the range of 12 microns to 28 microns. It is understood that thickness at of adhesive layer 169 may be widely varied and is not limited to these examples. In other embodiments, flexible circuit 150 may not include adhesive layer 169.

While flexible circuit 150 may be a single sided flexible circuit with only a single conductive layer 160 and a single dielectric layer 170, in other embodiments, flexible circuit 150 may include a stack of any suitable number of conductive layers and any suitable number of dielectric layers. For example, as shown in FIG. 1B, flexible circuit 150 may also include a bottom conductive layer 180 positioned along the bottom surface 178 of first dielectric layer 170. Bottom conductive layer 180 may be any suitable conductive layer and may be similar to top conductive layer 160. In some embodiments, an adhesive layer 189 may be provided between at least a portion of bottom conductive layer 180 and at least a portion of bottom surface 178 of first dielectric layer 170. Adhesive layer 189 may be any suitable adhesive and may be similar to adhesive layer 169. Moreover, in some embodiments, besides including multiple conductive layers, flexible circuit 150 may include multiple dielectric layers. For example, although not shown in FIG. 1B, flexible circuit 150 may include a second dielectric layer positioned on top of top conductive layer 160 or below bottom conductive layer 180.

Flexible circuit 150 may also include one or more conductive vias that may run through at least a portion of a dielectric layer. For example, a conductive via 174 may run through a portion of dielectric layer 170 and may be electrically coupled to one or more various portions of top conductive layer 160 and/or bottom conductive layer 180 at various positions along the length of flexible circuit 150 (e.g., between ends 152 and 158) for connecting traces along the conductive layers.

As shown in FIG. 1B, RFID circuitry 110 may include an RFID integrated circuit 120, an RFID antenna 140, and an RFID connector 130 that may couple integrated circuit 120 with antenna 140. RFID integrated circuit 120 may be any suitable circuitry for storing and/or processing information, modulating and/or demodulating RF signals, and any other specialized functions. RFID antenna 140 may be any suitable antenna for receiving and/or transmitting an RF signal (e.g., a slot antenna, a loop antenna, etc.), while RFID connector 130 may be any suitable connector for communicating an RF signal between integrated circuit 120 and antenna 140 (e.g., one or more conductive wires, traces, vias, etc.). At least one of integrated circuit 120, connector 130, and antenna 140 may be integrated into flexible circuit 150.

At least a portion of RFID integrated circuit 120 of RFID circuitry 110 may be integrated into any portion of flexible circuit 150. For example, as shown in FIG. 1B, a pocket 173 may be provided in dielectric layer 170 and at least a portion of RFID integrated circuit 120 may be positioned in pocket 173. In some embodiments, pocket 173 may be drilled or otherwise formed in top surface 172 of dielectric layer 170, such that pocket 173 may be exposed through an opening in top surface 172. Alternatively, pocket 173 may not be exposed at an opening in top surface 172 of dielectric layer 170, but instead pocket 173 may be positioned between top surface 172 and bottom surface 178 of dielectric layer 170 and surrounded on all of its sides by dielectric layer 170. Alternatively, in some embodiments, although not shown in FIG. 1B, at least a portion of RFID integrated circuit 120 may be integrated into conductive layer 160 or adhesive layer 169.

At least a portion of antenna 140 of RFID circuitry 110 may be integrated into any portion of flexible circuit 150. For example, as also shown in FIG. 1B, antenna 140 may be integrated into conductive layer 160. At least a portion of antenna 140 may be formed into conductive layer 160 using any suitable process, including, but not limited to, stamping, etching, mask imprinting (e.g., negative mask imprinting), photolithographying, and combinations thereof. Alternatively, in some embodiments, although not shown in FIG. 1B, at least a portion of RFID antenna 140 may be integrated into dielectric layer 170 or adhesive layer 169.

At least a portion of connector 130 of RFID circuitry 110 may be integrated into any portion of flexible circuit 150. For example, as also shown in FIG. 1B, at least a portion of connector 130 may be provided in conductive layer 160 and/or dielectric layer 170. Connector 130 may extend between integrated circuit 120 and antenna 140. Therefore, as shown in FIG. 1B, if at least a portion of integrated circuit 120 is positioned in pocket 173 of dielectric layer 170 and at least a portion of antenna 140 is integrated into conductive layer 160, then connector 130 may extend away from integrated circuit 120, out of pocket 173 of dielectric layer 170, through adhesive layer 169, into conductive layer 160, and towards antenna 140.

Although integrated circuit 120, connector 130, and antenna 140 of RFID circuitry 110 are all shown in FIG. 1B to be included in the same horizontal cross-section of flexible circuit 150, any one of these RFID components may be integrated into flexible circuit 150 at a different position along the length of flexible circuit 150 than the position of any other one of these RFID components. For example, while integrated circuit 120 may be positioned along flexible circuit 150 as shown in FIG. 1B (i.e., along flexible circuit 150 at position 151 of FIG. 1A), antenna 140 may instead be positioned along flexible circuit 150 closer to end 158 (i.e., along flexible circuit 150 at position 159 of FIG. 1A). In such an embodiment, connector 130 may extend along flexible circuit 150 between integrated circuit 120 at position 151 and antenna 140 at position 159 in any suitable manner (e.g., within various portions of dielectric layer 170, adhesive layer 169, and/or conductive layer 160).

RFID circuitry 110 (e.g., an RFID tag) may radiate RF signals for communication with an external RFID interrogator or reader. In order to minimize any RF interference that these RF signals may cause with respect to the other signaling of flexible circuit 150 (e.g., along conductive via 174 and/or portions of conductive layers 160 and 180); one or more insulation vias may be provided. For example, as shown in FIG. 1B, a first insulation via 154 may be provided through at least a portion of flexible circuit 150 between its top and bottom. Insulation via 154 may be any suitable insulator, such as a through hole that is plated or not plated (e.g., with copper), which can block at least some RF signals of RFID circuitry 110 from interfering with another portion of flexible circuit 150. For example, insulation via 154 may extend from top conductive layer 160, through dielectric layer 170, and to bottom conductive layer 180, thereby dividing flexible circuit 150 into an "RFID data" portion 153 and a "flex data" portion 155. Insulation via 154 may shield flex data portion 155 from at least some RF radiating from RFID circuitry 110 in the direction of arrow R of FIG. 1B. Thus, RF radiating from RFID circuitry 110 may be radiated out a side of flexible circuit 150 in the direction of arrow L of FIG. 1B. Of course, RFID circuitry 110 may also radiate RF out the top of flexible circuit 150 in the direction of arrow U and/or out the bottom of flexible circuit in the direction of arrow D.

In some embodiments, RFID circuitry 110 may include multiple RFID antennas or multiple antenna portions coupled to integrated circuit 120. For example, as shown in FIG. 1B, RFID circuitry 110 may also include second antenna portion 140*a*, which may be coupled to integrated circuit 120 via a second connector portion 130*a*. Second antenna portion 140*a* may be positioned in any suitable layer or layers of flexible circuit 150, including the layer in which antenna 140 is positioned or a different layer. As shown in FIG. 1B, second antenna portion 140*a* may be integrated into bottom conductive layer 180. For example, first antenna portion 140 and second antenna portion 140*a* may be contact portions of a loop antenna. Alternatively, first antenna portion 140 and second antenna portion 140*a* may each be a distinct antenna. For example, first antenna 140 may be a slot antenna and second antenna 140*a* may be a loop antenna.

Additional RFID circuitry may be integrated into flexible circuit 150 in addition to RFID circuitry 110. For example, as shown in FIG. 1B, second RFID circuitry 110' may be integrated into flexible circuit 150. Second RFID circuitry 110' may be substantially similar to RFID circuitry 110 and may include an RFID integrated circuit 120', an RFID connector 130', and an RFID antenna 140'. In some embodiments, as opposed to being positioned within a pocket of dielectric layer 170, RFID integrated circuit 120' may be positioned between bottom surface 178 of dielectric layer 170 and adhesive layer 189, or conductive layer 180 if there is no adhesive layer provided.

In some embodiments, a second insulation via 156 may be provided through at least a portion of flexible circuit 150 between its top and bottom and may be similar to insulation via 154. For example, insulation via 156 may extend from top conductive layer 160, through dielectric layer 170, and to bottom conductive layer 180, thereby dividing flexible circuit 150 into an RFID data portion 157 and flex data portion 155. Such an insulation via may prevent at least some RF radiating from second RFID circuitry 110' from radiating in the direction of arrow L of FIG. 1B towards flex data portion 155 of flexible circuit 150. Thus, RF radiating from second RFID circuitry 110' may be radiated out a side of flexible circuit 150 in the direction of arrow R of FIG. 1B. Of course, second RFID circuitry 110' may also radiate RF out the top of flexible circuit 150 in the direction of arrow U and/or out the bottom of flexible circuit in the direction of arrow D.

In order to promote the radiation of RF from RFID circuitry, at least a portion of a conductive layer may not extend across the entire width of flexible circuit 150. For example, as shown in FIG. 1B, top conductive layer 160 may not extend past insulation via 156 into RFID data portion 157 (e.g., top conductive layer 160 may not extend to a position adjacent at least a portion of second RFID circuitry 110'). A portion of conductive layer 160 may be removed or never provided at all such that it does not extend adjacent second RFID circuitry 110'. The absence of conductive layer 160 in RFID data portion 157 may help second RFID circuitry 110' radiate RF out of flexible circuit 150 at least in the direction of arrow U.

Figure 2:
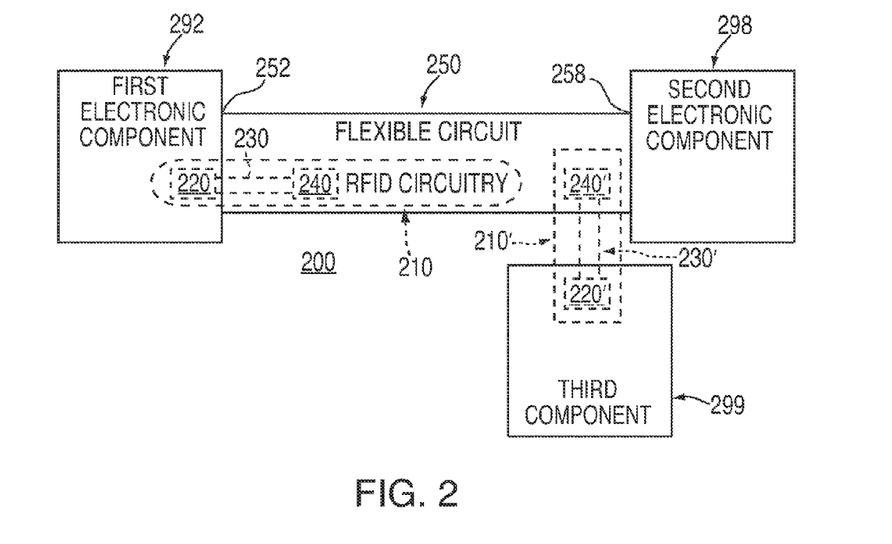
FIG. 2 is an illustrative top view of another system with RFID circuitry integrated into a flexible circuit, in accordance with some embodiments of the invention.

In other embodiments, only a portion of RFID circuitry may be integrated into a flexible circuit while another portion of the RFID circuitry may be provided off of the flexible circuit. For example, as shown in FIG. 2, a system 200 may be similar to system 100 but, rather than having an RFID integrated circuit integrated into a flexible circuit, system 200 may provide an RFID integrated circuit off of the flexible cable. System 200 may include RFID circuitry 210 having an RFID antenna 240 that may be integrated into a flexible circuit 250 and an RFID integrated circuit 220 that may be provided on a first electronic component 292. RFID circuitry 210 may also include an RFID connector 230 coupling RFID integrated circuit 220 and RFID antenna 240. For example, RFID connector 230 may extend away from RFID antenna 240, through flexible circuit 250 (e.g., through one or more conductive layers and/or one or more dielectric layers of flexible circuit 250), and then externally away from flexible circuit 250 to RFID integrated circuit 220.

Like system 100, system 200 may also include first electronic component 292 coupled to a first end 252 of flexible circuit 250 and a second electronic component 298 coupled to a second end 258 of flexible circuit 250. Each one of components 292 and 298 may be any suitable electronic component capable of communicating one or more signals via flexible circuit 250, and first electronic component 292 may be any suitable component capable of supporting RFID integrated circuit 220. For example, first electronic component 292 may be a processing component, a memory component, a circuit board, or the like. Moreover, like system 100, system 200 may be a single electronic device that includes RFID circuitry 210, flexible circuit 250, and one or both of first electronic component 292 and second electronic component 298. Alternatively, system 200 may include RFID circuitry 210, flexible circuit 250, and first electronic component 292, with or without second electronic component 298, each of which may be distinct electronic components not provided in a single electronic device.

Rather than providing an RFID integrated circuit on an electronic component that is coupled to the flexible circuit, the RFID integrated circuit may be provided off of the flexible circuit in a location independent of the flexible circuit. For example, as also shown in FIG. 2, system 200 may include second RFID circuitry 210', which may be similar to RFID circuitry 210, except that RFID integrated circuit 220' of second RFID circuitry 210' may not be provided on an electronic component coupled to flexible circuit 250. Instead, RFID connector 230' may extend away from RFID antenna 240', through flexible circuit 250 (e.g., through one or more conductive layers and/or one or more dielectric layers of flexible circuit 250), and then externally away from flexible circuit 250 to RFID integrated circuit 220', which may be provided on a third component 299 that is not coupled to flexible circuit 250. Third component 299 may be an electronic component similar to first electronic component 292, or third component 299 may not be electronic at all but instead may be a housing component of an electronic device, for example.

Figure 3:
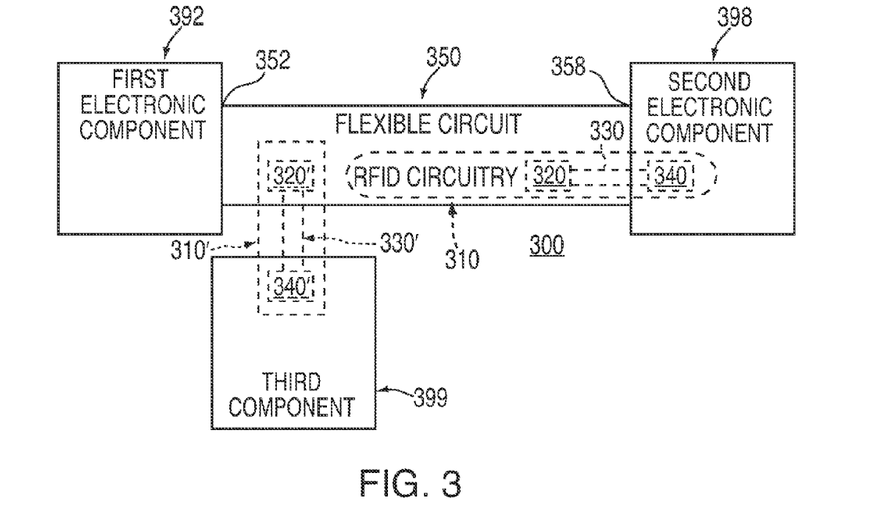
FIG. 3 is an illustrative top view of yet another system with RFID circuitry integrated into a flexible circuit, in accordance with some embodiments of the invention.

In yet other embodiments, rather than providing an RFID integrated circuit off of the flexible circuit, the RFID integrated circuit may be integrated into the flexible circuit and an RFID antenna may be provided off of the flexible circuit. For example, as shown in FIG. 3, a system 300 may be similar to system 100 but, rather than having an RFID antenna integrated into a flexible circuit, system 300 may provide an RFID antenna off of the flexible cable. System 300 may include RFID circuitry 310 having an RFID integrated circuit 320 that may be integrated into a flexible circuit 350 and an RFID antenna 340 that may be provided on a second electronic component 398. RFID circuitry 310 may also include an RFID connector 330 coupling RFID integrated circuit 320 and RFID antenna 340. For example, RFID connector 330 may extend away from RFID integrated circuit 320, through flexible circuit 350 (e.g., through one or more conductive layers and/or one or more dielectric layers of flexible circuit 350), and then externally away from flexible circuit 350 to RFID antenna 340.

Like system 100, system 300 may also include a first electronic component 392 coupled to a first end 352 of flexible circuit 350 as well as second electronic component 398 coupled to a second end 358 of flexible circuit 350. Each one of components 392 and 398 may be any suitable electronic component capable of communicating one or more signals via flexible circuit 350, and second electronic component 398 may be any suitable component capable of supporting RFID antenna 340. For example, second electronic component 398 may be a processing component, a memory component, a circuit board, or the like. In some embodiments, second electronic component 398 may be an antenna of another type, such as a Bluetooth™ antenna. Moreover, like system 100, system 300 may be a single electronic device that includes RFID circuitry 310, flexible circuit 350, and one or both of first electronic component 392 and second electronic component 398. Alternatively, system 300 may include RFID circuitry 310, flexible circuit 350, and second electronic component 398, with or without first electronic component 392, each of which may be distinct electronic components not provided in a single electronic device.

Rather than providing an RFID antenna on an electronic component that is coupled to the flexible circuit, the RFID antenna may be provided off of the flexible circuit in a location independent of the flexible circuit. For example, as also shown in FIG. 3, system 300 may include second RFID circuitry 310', which may be similar to RFID circuitry 310, except that RFID antenna 340' of second RFID circuitry 310' may not be provided on an electronic component coupled to flexible circuit 350. Instead, RFID connector 330' may extend away from RFID integrated circuit 320', through flexible circuit 350 (e.g., through one or more conductive layers and/or one or more dielectric layers of flexible circuit 350), and then externally away from flexible circuit 350 to RFID antenna 340', which may be provided on a third component 399 that is not coupled to flexible circuit 350. Third component 399 may be an electronic component similar to second electronic component 398, or third component 399 may not be electronic at all but instead may be a housing component of an electronic device, for example.

Figure 4:
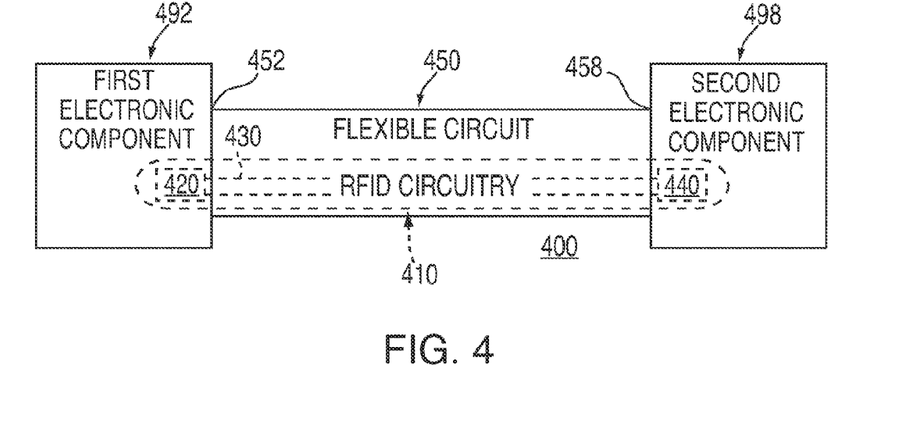
FIG. 4 is an illustrative top view of yet still another system with RFID circuitry integrated into a flexible circuit, in accordance with some embodiments of the invention.

In yet still other embodiments, rather than integrating at least one of an RFID integrated circuit and an RFID antenna into a flexible circuit, each of the RFID integrated circuit and the RFID antenna may be provided off of the flexible circuit and coupled to one another by an RFID connector that is integrated into the flexible circuit. For example, as shown in FIG. 4, a system 400 may be similar to system 100 but, rather than having an RFID integrated circuit and an RFID antenna integrated into a flexible circuit, system 400 may provide an RFID integrated circuit and an RFID antenna off of the flexible cable and an RFID connector Integrated into the flexible cable. System 400 may include RFID circuitry 410 and a flexible circuit 450. RFID circuitry 410 may include an RFID integrated circuit 420 that may be provided on a first electronic component 492 and an RFID antenna 440 that may be provided on a second electronic component 498. RFID circuitry 410 may also include an RFID connector 430 coupling RFID integrated circuit 420 and RFID antenna 440. RFID connector 430 may be integrated into flexible circuit 450. For example, RFID connector 430 may extend away from RFID integrated circuit 420, into flexible circuit 450, through flexible circuit 450 (e.g., through one or more conductive layers and/or one or more dielectric layers of flexible circuit 450), and then externally away from flexible circuit 450 to RFID antenna 440.

Like system 100, system 400 may include first electronic component 492 coupled to a first end 452 of flexible circuit 450 as well as second electronic component 498 coupled to a second end 458 of flexible circuit 450. Each one of components 492 and 498 may be any suitable electronic component capable of communicating one or more signals via flexible circuit 450, first electronic component 492 may be any suitable component capable of supporting RFID integrated circuit 420, and second electronic component 498 may be any suitable component capable of supporting RFID antenna 440. For example, first Electronic component 492 may be a circuit board and second electronic component 498 may be a Bluetooth™ antenna. Moreover, like system 100, system 400 may be a single electronic device that includes RFID circuitry 410, flexible circuit 450, first electronic component 492, and second electronic component 498. Alternatively, the components of system 400 may be distinct and not provided in a single electronic device. Moreover, as described with respect to RFID integrated circuit 220' of FIG. 2 and RFID antenna 340' of FIG. 3, one or both of RFID integrated circuit 420 and RFID antenna 440' may be provided off of flexible circuit 450 in a location independent of flexible circuit 450 (not shown) rather than being provided on an electronic component that is coupled to flexible circuit 450.

Figure 5:
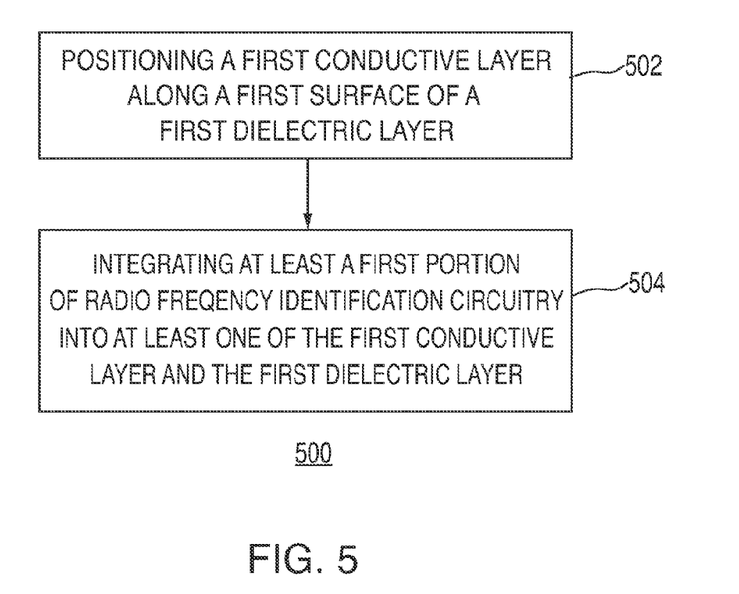
FIG. 5 is a flowchart of an illustrative process for integrating RFID circuitry into a flexible circuit, in accordance with some embodiments of the invention.

FIG. 5 shows a flowchart of an illustrative process 500 for forming a flexible circuit. Process 500 may begin at step 502 by positioning a first conductive layer along a first surface of a first dielectric layer, and integrating at least a first portion of RFID circuitry into at least one of the first conductive layer and the first dielectric layer at step 504. In some embodiments, the first portion of the RFID circuitry may be an RFID integrated circuit. Integrating an RFID integrated circuit may include positioning the RFID integrated circuit between the first conductive layer and the first surface of the first dielectric layer, or between one of those two layers and an adhesive layer joining those two layers. Alternatively, integrating an RFID integrated circuit may include forming a pocket into the first dielectric layer and positioning at least a portion of the RFID integrated circuit within the pocket. In some embodiments, the first portion of the RFID circuitry may be an RFID antenna. Integrating an RFID antenna may include forming, stamping, etching, mask imprinting, and/or photolithographying at least a portion of the antenna into the first conductive layer. In some embodiments, all of the RFID circuitry may be integrated into at least one of the first conductive layer and the first dielectric layer.

It is to be understood that the steps shown in processes 500 of FIG. 5 is merely illustrative. Any of the steps may be removed, modified, or combined, any additional steps may be added, and the order of certain steps may be altered, without departing from the scope of the invention.

While there have been described systems and methods for integrating RFID circuitry into flexible circuits, it is to be understood that many changes may be made therein without departing from the scope of the invention. It is also to be understood that various directional and orientational terms such as "up" and "down," "left" and "right," "top" and "bottom," and "above" and "below," are used herein only for convenience, and that no fixed or absolute directional or orientational limitations are intended by the use of these words.

The described embodiments of the invention are presented for the purpose of illustration and not of limitation.

What is claimed is:

1. A method of forming a flexible circuit, the method comprising:
    positioning a first conductive layer along a first surface of a dielectric layer;
    integrating at least a first portion of radio-frequency identification (RFID) circuitry into one of the first conductive layer and the dielectric layer, wherein the first portion of the RFID circuitry comprises an integrated circuit, and the integrating comprises:
        forming a pocket into the dielectric layer, and
        positioning at least a portion of the integrated circuit within the pocket; and
    integrating a second portion of the RFID circuitry into one of the first conductive layer and the dielectric layer, wherein the second portion of the RFID circuitry comprises an antenna.

2. The method of claim 1, further comprises:
    positioning at least a portion of the antenna within the pocket.

3. The method of claim 1, further comprising: integrating the second portion of the RFID circuitry between an insulation via and a side of the flexible circuit opposite the insulation via.

4. The method of claim 1, further comprising:
    coupling a first portion of the first conductive layer to a first electronic component; and
    coupling a second portion of the first conductive layer to a second electronic component.

5. The method of claim 4, wherein the first conductive layer electrically couples the integrated circuit to the antenna.

6. The method of claim 4, wherein:
    a third portion of the RFID circuitry comprises a connector; and
    the connector electrically couples the integrated circuit to the antenna.

7. The method of claim 1, further comprising:
    positioning the RFID circuitry between an insulation via and a side of the flexible circuit allowing RF signals to be radiated from the RFID circuitry through the side of the flexible circuit.

8. The method of claim 1, further comprising:
    forming a conductive via through at least a portion of the dielectric layer; and
    electrically coupling the conductive via to one or more various portions of the first conductive layer.

9. The method of claim 1, further comprising:
    positioning at least a first portion of a second RFID circuitry in a first component; and
    coupling the first component to the flexible circuit through an RFID connector included in the second RFID circuitry, wherein the first component includes at least one of a separate flexible circuit and a housing component.

10. The method of claim 1, wherein the steps further comprise:
    electrically coupling the integrated circuit to the antenna using the first conductive layer.

11. The method of claim 1, wherein the steps further comprise:
    coupling an electronic component to the flexible circuit using an RFID connector.

12. The method of claim 11, wherein the electronic component is a housing component of an electronic device.

13. A method of forming a flexible circuit, the method comprising:
    positioning a first conductive layer along a first surface of a dielectric layer;
    integrating at least a first portion of radio-frequency identification (RFID) circuitry into one of the first conductive layer and the dielectric layer;
    coupling a first portion of the first conductive layer to a first electronic component;
    coupling a second portion of the first conductive layer to a second electronic component; and
    separating a flex data portion from an RFID data portion in the flexible circuit with an insulation via.

14. The method of claim 13, wherein separating the flex data portion from the RFID data portion comprises:
    extending the insulation via from the first conductive layer through the dielectric layer to a second conductive layer located opposite the first conductive layer relative to the dielectric layer.

15. The method of claim 13, further comprising:
    separating the flex data portion in the flexible circuit from an extra RFID data portion with an extra insulation via through at least a portion of the flexible circuit.

16. The method of claim 15, further comprising:
    forming an extra RFID antenna and an integrated circuit in the extra RFID data portion.

17. The method of claim 13, further comprising:
    coupling a third electronic component to the flexible circuit through a second portion of the RFID circuitry.

18. The method of claim 17, wherein the third electronic component is a housing component of an electronic device.

19. The method of claim 13, wherein the steps further comprise:

positioning the RFID circuitry between the insulation via and a side of the flexible circuit allowing RF signals to be radiated from the RFID circuitry through the side of the flexible circuit.

20. The method of claim 13, wherein the steps further comprise:

forming a conductive via through at least a portion of the dielectric layer; and electrically coupling the conductive via to one or more various portions of the first conductive layer.

* * * * *